United States Patent [19]

Misawa et al.

[11] 4,244,055
[45] Jan. 6, 1981

[54] TUNER WITH PHASE LOCKED LOOP SYNTHESIZER

[75] Inventors: Akira Misawa; Tatsuo Numata, both of Tokyo, Japan

[73] Assignee: Pioneer Electronic Corporation, Tokyo, Japan

[21] Appl. No.: 951,819

[22] Filed: Oct. 16, 1978

[30] Foreign Application Priority Data

Oct. 17, 1977 [JP] Japan ............................ 52-123443
Oct. 31, 1977 [JP] Japan ............................ 52-129632

[51] Int. Cl.³ .......................... H04B 1/10; H04B 1/26
[52] U.S. Cl. ................................ 455/174; 455/183; 455/194
[58] Field of Search ............... 325/419, 453, 455, 459, 325/464, 468, 456, 457, 470, 478; 358/191, 191.1; 455/260, 155, 157, 170, 174, 175, 177, 179, 183, 194, 200, 212, 218

[56] References Cited

U.S. PATENT DOCUMENTS

| | | | |
|---|---|---|---|
| 3,437,936 | 4/1969 | Tompson | 325/456 |
| 3,707,597 | 12/1972 | Lunn | 325/456 |
| 3,927,376 | 12/1975 | Ferrie | 325/478 |
| 3,962,641 | 6/1976 | Suwa | 325/455 |
| 4,131,853 | 12/1978 | Dreiske | 325/455 |
| 4,163,203 | 7/1979 | Morii et al. | 455/155 |
| 4,170,760 | 10/1979 | Umeda | 325/455 |

Primary Examiner—Marc E. Bookbinder
Attorney, Agent, or Firm—Sughrue, Rothwell, Mion, Zinn and Macpeak

[57] ABSTRACT

A PLL tuning device in a receiver uses a digital memory board and array of photo-transistors scanning the memory board for station selection. When the transistors are lined up with a column, a digital output is fed to a switching device and to a programmable frequency divider. Muting action is released when the output is delivered to the divider, but, when the array is between columns, muting action takes place. In one embodiment, the photo-transistor output is fed to a latch and to an OR gate serving as the switch. A one-shot is triggered in response to the setting of the OR gate at an H level. Digital information is fed to the programmable frequency divider from the latch until the one-shot is fired. In another embodiment, the latch and one-shot are eliminated. Photo-transistor output is fed to both an OR gate and the frequency divider. The OR gate controls a switch that closes muting switches only when information is being generated by the photo-transistors. However, when the sensor array is between signals the tuner is maintained in a muted state.

5 Claims, 7 Drawing Figures

TUNER WITH PHASE LOCKED LOOP SYNTHESIZER

BACKGROUND OF THE INVENTION

This invention relates to a tuning device employing a phase locked loop (PLL) synthesizer for use in a radio receiver.

A digital tuning device employing the PLL synthesizer is extensively used in FM receivers. In a digital tuning device for the PLL synthesizer, if it is necessary to generate a digital code for determining the frequency division number of a programmable frequency divider inserted in the PLL.

For this purpose, a purely electronic method a combination of an up-down counter and a multivibrator, etc. has been proposed. A method using a memory board, such as punched card, for storing binary information and a sensor for reading the binary information on the memory board has been also proposed for this purpose.

However, the purely electronic method is disadvantageous in that it is necessary to provide an upper and lower limit detecting circuit. As a result the manufacturing cost becomes higher than that of the second method using a memory board.

The latter method is superior to the purely electronic method in view of cost considerations as mentioned above. However, the second method has a number of disadvantages which will now be described.

Referring to FIG. 1a and FIG. 1b a digital code storing perforated board 1 has perforations through which light from a light source 2 passes to give a predetermined digital code to photo-transistors 6-1 through 6-N on a photo-transistor holder 4 (FIG. 1(b)). The perforated board 1 may be planar as shown in FIG. 1(a) or cylindrical. That is, the configuration of the perforated board 1 may be selected as desired to satisfy differing requirements such as space, packaging, etc.

When the photo-transistor holder 4 is on line A or B of the perforated board 1 for instance, no difficulty is encountered; that is, the relevant digital code can be properly sensed. However, when the photo-transistor holder is on the line C between the lines A and B, the bits of the digital code may be all at an "L" level or the digital codes on the lines A and B may be erroneously sensed and used as input signals. Thus, the positional relationships between the perforations 3 in the perforated board 1 and the phototransistors 6 may involve problems to be solved.

In order to solve this problem of proper orientation, a method has been proposed in which a click board 5 is arranged below the perforated board 1. A leaf spring 9 abutting against the teeth of the click board 5 is secured to the holder 4 so that the photo-transistors 6 are moved regularly or at predetermined intervals. However, if this technique is utilized in a receiver, it is difficult to obtain the feeling of smooth operation which has been conventionally provided by the combination of a tuning knob and a flywheel. In addition, the method is disadvantageous in that the width of movement of a dial pointer which can be achieved by one discrete operation since the inertia of the flywheel is reduced, and the tuning operation becomes rather difficult.

SUMMARY OF THE INVENTION

An object of the present invention is to provide an improved tuning device using a phase locked loop synthesizer by which the tuning can be carried out with the feeling of smooth operation similarly as in the conventional receiver.

Another object of the present invention is to provide a circuit device for use in a tuner, by which the tuning operation is achieved only when the sensor comes exactly into registration with a code on a perforated board.

A further object of the present invention is to provide a circuit device for use in a tuner, by which the receiver is insensitive when the sensor is out of registration with a code on a perforated board.

This invention uses a photo-transistor array to scan a memory board for station data. Output data is fed to the programmable frequency divider for formation of a muting control signal and tuning control. Muting action is maintained in the tuner when the array is not positioned to sense particular station information, i.e. between columns on the memory board. The sensor is mounted on a holder, in turn driven by a flywheel mounted thread to achieve smooth tuning. The output of the photo-transistors is either fed to a latch or in a second embodiment directly to the frequency divider. In either case, the output is supplied to an OR gate raised to a high state when discrete station output data is present. If a latch is used, a one-shot is actuated by the OR gate to release data stored in the latch to the divider. In the second embodiment, the OR gate controls muting switches that are open when the OR gate is at a high level.

These and other objects of this invention will be described with respect to the drawings and the preferred embodiment that follows.

DETAILED DESCRIPTION OF THE EMBODIMENTS

Figure 2:
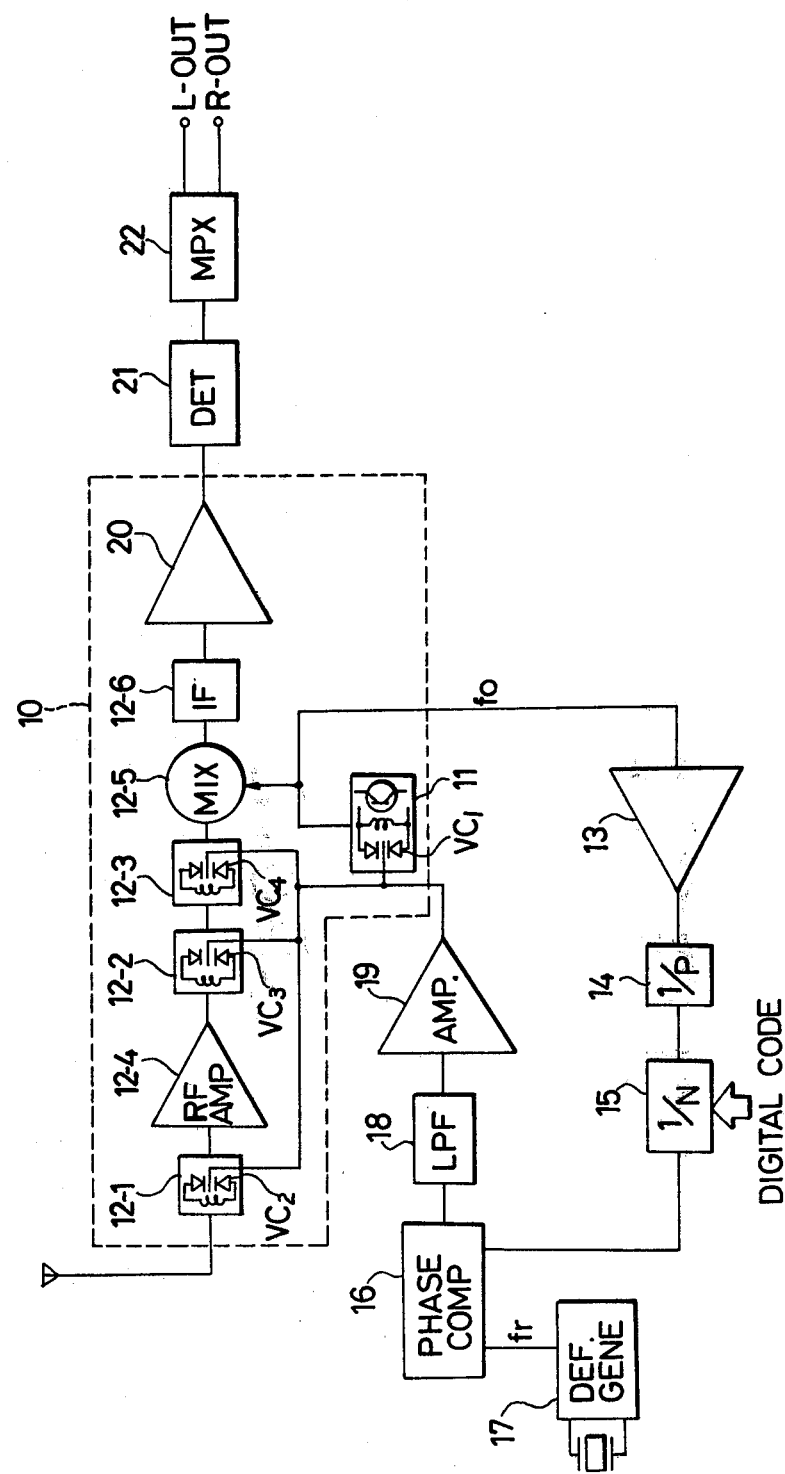
FIG. 2 is a tuning system of the FM state receiver.

One preferred embodiment of this invention will now be described with reference to FIGS. 2 through 4. FIG. 2 is a block diagram showing a phase locked loop synthesizer. A front end portion is encircled by the broken line 10 in FIG. 2. The front end portion 10 comprises a voltage-controlled local oscillator 11 employing a voltage-controlled variable reactance element VC1, and high frequency selection tuning circuits 12-1 through 12-3 employing voltage-controlled variable reactance elements VC2 through VC4, respectively. The output frequency fo of the voltage-controlled local oscillator 11 is applied through a buffer circuit 13 to a prescaler 14, in which it is subjected to 1/P frequency division where P is an integer.

The output frequency thus frequency-divided is subjected to 1/N frequency division in a programmable frequency divider 15 where N is an integer and is applied to one input terminal of a phase comparator 16. A reference frequency fr from a reference frequency generator 17 using, for instance, a crystal oscillator is applied to the other input terminal of the phase comparator 16 so that the frequency fo/P·N is compared with the frequency fr in the phase comparator 16. Because of the characteristics of the phase locked loop, 1/N·P of the output frequency fo of the voltage-controlled local oscillator 11 acts to synchronize with the reference frequency fr. Accordingly, a local oscillation output frequency fo=N·P·fr is obtained as an output of the voltage-controlled local oscillator 11. In FIG. 2, reference numerals 18 and 19 designate a low-pass filter and an amplifier, respectively.

With the reference frequency fr and the frequency division number P of the prescaler 14 being held constant, selecting the frequency division number N of the programmable frequency divider 15 as desired can provide an output frequency as required. The control voltage applied to the voltage-controlled local oscillator 11 is applied also to the voltage-controlled variable reactance elements VC2 through VC4 in the high-frequency selection tuning circuits 12-1 through 12-3, thereby to vary the tuning frequency.

By suitably selecting the frequency division number N to be given to the programmable frequency divider 15, a particular broadcast radio wave can be received. The high frequency signal is mixed with the local oscillation signal of the voltage-controlled local oscillator 11 in the mixer 12-5, the output of which is applied through an intermediate frequency selecting circuit 12-6 and a buffer 20 to an FM detecting circuit 21. The output of the FM detecting circuit 29 is applied to an MPX circuit 22, where it is separated into left signal L and right signal R components.

Figure 1A:
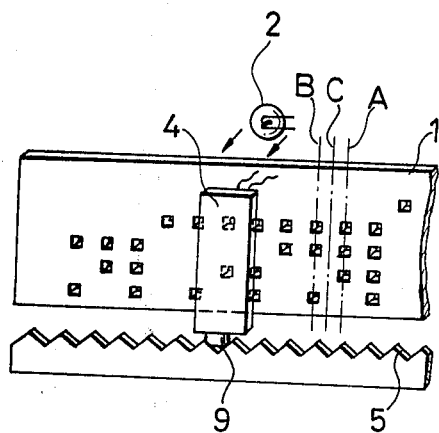
FIGS. 1a and 1b show an example of the conventional digital code sensing mechanism.
Figure 1B:
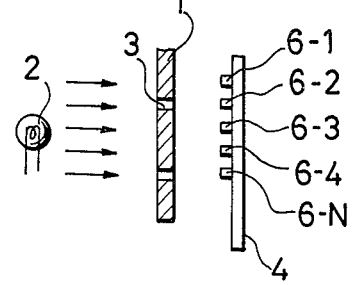
Figure 3:
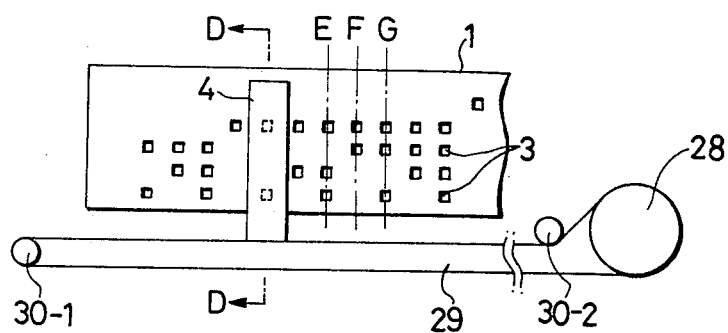
FIG. 3 is a preferred embodiment of a digital code sensing mechanism according to the present invention applicable to the receiver in FIG. 2.

FIG. 3 illustrates an arrangment for forming a digital code comprising several bits which are applied to the above-described programmable frequency divider 15. The arrangement differs from that in FIG. 1 in that the click mechanism (5,9) in FIG. 1 is not utilized. A continuous shifting mechanism comprising a manual tuning knob 28, a dial thread or cord 29 wound on the knob 28, and pulleys 30-1 and 30-2 is employed. The photo-transistor holder 4 which is used also as the dial pointer is secured to the dial thread 29. Therefore, as the manual tuning knob 28 is rotated, the holder 4 is moved continuously right or left over the perforated board.

Figure 5:
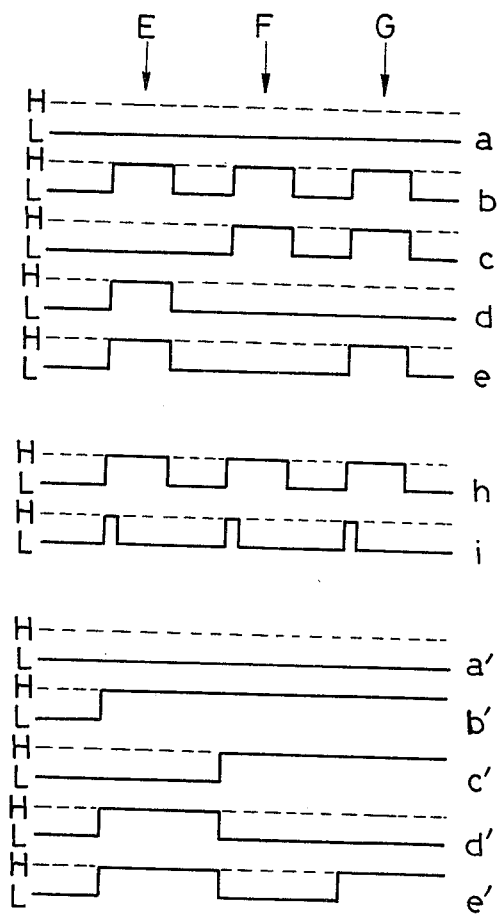
FIG. 5 is a waveform chart of outputs of the circuit in FIG. 4 with the sensor position.
Figure 4:
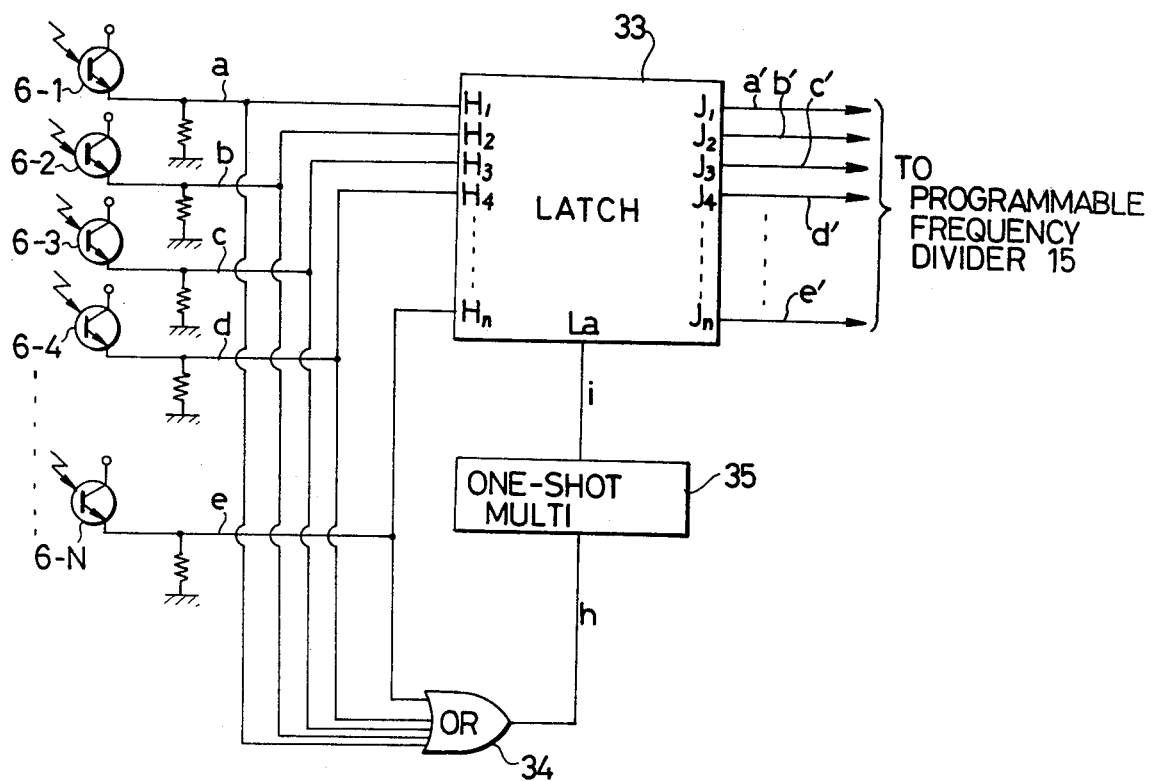
FIG. 4 is a preferred embodiment of the present invention.

FIG. 4 shows one embodiment for processing digital codes which are obtained by the arrangement shown in FIG. 3 and FIG. 5 shows waveforms at various points in FIG. 4. The function of the circuitry shown in FIG. 4 will now be described with reference to the waveforms in FIG. 5.

In the situation when the photo-transistor holder 4 is allowed to pass through phantom lines E, F and G in the described order in FIG. 3, signals a through e from the photo-transistors 6-1 through 6-N are applied, as data information, to a latch circuit 33 and are applied also to an OR circuit 34. As a result, the output of the OR circuit 34 is set to an "H" level by any one of the signals a through e, whereby information h is obtained. Information signal h is applied to a one-shot multivibrator 35, so that information signal i is obtained. This information signal i is applied, as latch information, to the latch control terminal La of the latch circuit 33. As a result signals a' through e' corresponding to the signals a through e are obtained at the output of the latch circuit 33 and are then applied to the programmable frequency divider 15.

In other words, in the latch circuit 33, the digital signal which has been applied to the input terminals $H_1$ through $H_n$ thereof is held to be applied to output terminals $J_1$ through $J_n$ until the signal i is applied to the latch control terminal La. Upon application of the signal i to the latch control terminal La, the digital signal which has been held in the latch circuit is eliminated, and a new digital signal composed of new signals a to e is supplied to the input terminals $H_1$ through $H_n$ of the latch circuit.

It is clear from the waveforms indicated by a' through e' in FIG. 5, while the photo-transistors 6-1 through 6-N are moved from the line E to the line F and from the line F to the line G, the difficulties of the prior art are eliminated. All of the signals a' through e' to be applied to the programmable frequency divider 15 are not set to the "L" level and codes of two columns are not inputted when the photo-transistors are between the lines.

Alternatively, by providing a pair of switches between the multiplexer 22 and the output terminals Lout and Rout in FIG. 2 it is possible to eliminate the latch circuit 33 and the one-shot multivibrator 35 in FIG. 4.

Figure 6:
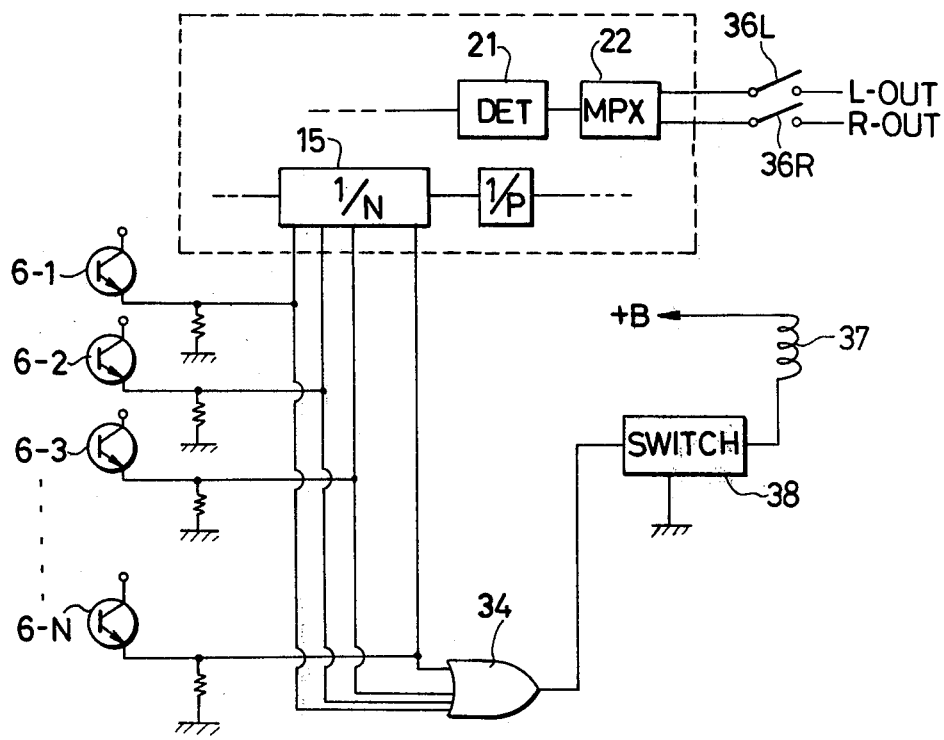
FIG. 6 is a second preferred embodiment of the present invention.

FIG. 6 shows another embodiment in which the latch circuit and the one-shot multivibrator are eliminated and instead thereof a pair of switches 36L and 36R are inserted between the multiplexer 22 and the output terminals.

In FIG. 6, reference characters 6-1 through 6-N designate photo-transistors provided on the photo-transistor holder 4. The emitters of these photo-transistors are connected to the programmable frequency divider 15 and to the input terminals of the OR circuit 34. As is the previous embodiment, only when the holder 4 is moved to, for instance, the line E, F or G, light from the light source 2 can pass through the relevant perforations 3 to irradiate the respective photo-transistors 6. As a result, the photo-transistors 6 are turned on to raise the output of the OR circuit 34 to the "H" level. Accordingly, the switch circuit 38 is turned on to energize the relay coil 37, whereby the muting switches 36L and 36R are closed. When the holder 4 is placed, for instance, between the lines G and F (or E and F) where no digital code to be applied to the programmable frequency divider 15 is provided, no signal is applied to the inputs of the OR circuit 34 by the photo-transistors. As a result, the output of the OR circuit 34 is set to the "L" level, and in contrast to the above-described case, the muting switches 36L and 36R are opened, and therefore the tuner is maintained in muting state.

As is apparent from the above description, in this invention, the digital codes provided on the digital code storing perforated board to be applied to the programmable frequency divider are utilized when they are to form the muting control signal. Accordingly, only when the digital code is applied to the programmable frequency divider is the muting action released. When the sensor is placed between adjacent codes, the muting action can be correctly effectuated. Therefore, according to the invention, the reliability of the muting operation of the tuner of this type employing digital codes for selecting stations can be significantly improved.

Other variations of this invention are possible without departing from the scope of the invention.

What is claimed is:

1. A tuner of the phase-locked loop type and comprising: a digital memory board with station data stored thereon at discrete data positions; means for scanning said board and delivering a digital output indicative of said station data; a voltage-controlled variable frequency oscillator for generating a local frequency corresponding to the local frequency signal of a selected station; a programmable frequency divider for dividing the local frequency by a variable dividing ratio determined by said digital output; and means responsive to the divided frequency and to a reference frequency for producing a corresponding control voltage which is applied to said voltage controlled oscillator for determining said local frequency in dependence on said dividing ratio of said frequency divider; and muting control circuit means responsive to said digital output for muting said tuner when said scanning means is between said discrete data positions on said memory board, said muting means comprising an OR circuit responsive to said digital output to mute said tuner when said digital output does not contain said station data.

2. The tuner of claim 1 wherein said means for scanning comprises an array of photo-transistors mounted on a holder, said holder driven by a cable member mounted around a tuning knob.

3. The tuner of claim 1 or 2 further comprising latch means receiving the digital output of said scanning means, a one-shot multivibrator coupled between said OR circuit and said latch, whereby when said scanning means generates a digital output, said OR circuit is raised to a high level actuating said one-shot, and the output pulse of said one-shot is delivered to said latch to transfer the digital data stored therein to said frequency divider.

4. The tuner of claim 1 or 2 further comprising switch means controlled by said OR circuit for selectively passing the output of the tuner, said switch means being closed when said OR circuit is raised to a high state by the digital output of said scanning means, said scanning means also delivering said digital output to said frequency divider.

5. The tuner of claim 4 wherein said switch means comprises a switch circuit responsive to the OR circuit output, a relay coil coupled to muting switches, said relay coil being selectively energized by said switch circuit.

* * * * *